(12) United States Patent
Nagata

(10) Patent No.: US 7,067,222 B2
(45) Date of Patent: Jun. 27, 2006

(54) PELLICLE FOR LITHOGRAPHY

(75) Inventor: Yoshihiko Nagata, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 215 days.

(21) Appl. No.: 10/695,871

(22) Filed: Oct. 30, 2003

(65) Prior Publication Data

US 2004/0091796 A1     May 13, 2004

(30) Foreign Application Priority Data

Nov. 5, 2002     (JP)     ............................ 2002-321008

(51) Int. Cl.
*G01F 9/00* (2006.01)

(52) U.S. Cl. .......................................................... 430/5

(58) Field of Classification Search .................... 430/5, 430/322; 428/14
See application file for complete search history.

(56) References Cited

U.S. PATENT DOCUMENTS 4,861,402 A     8/1989     Gordon
6,548,129 B1 *     4/2003     Matsukura et al. ........... 428/14
6,593,034 B1 *     7/2003     Shirasaki ....................... 430/5

FOREIGN PATENT DOCUMENTS

| JP | A 58-219023 | 12/1983 |
|---|---|---|
| JP | B2 2644457 | 5/1997 |
| JP | A 10-421 | 1/1998 |
| JP | B2 63-27707 | 6/1998 |

* cited by examiner

*Primary Examiner*—S. Rosasco
(74) *Attorney, Agent, or Firm*—Oliff & Berridge PLC

(57) ABSTRACT

There is provided a pellicle for lithography which has at least, a pellicle film for dustproof protection, a pellicle frame to which the pellicle film is adhered, an adhesive layer provided on one end face of the pellicle frame in order to adhere the pellicle film, and a sticking layer formed on another end face of the pellicle frame, wherein the pellicle film is formed by a die coating machine and a method for producing it. There can be provided a relatively large-sized pellicle for lithography which has a pellicle film with little unevenness of film thickness and with a uniform and high light transmission can be produced easily and at low cost, compared with those using the conventional spin coater.

2 Claims, 2 Drawing Sheets

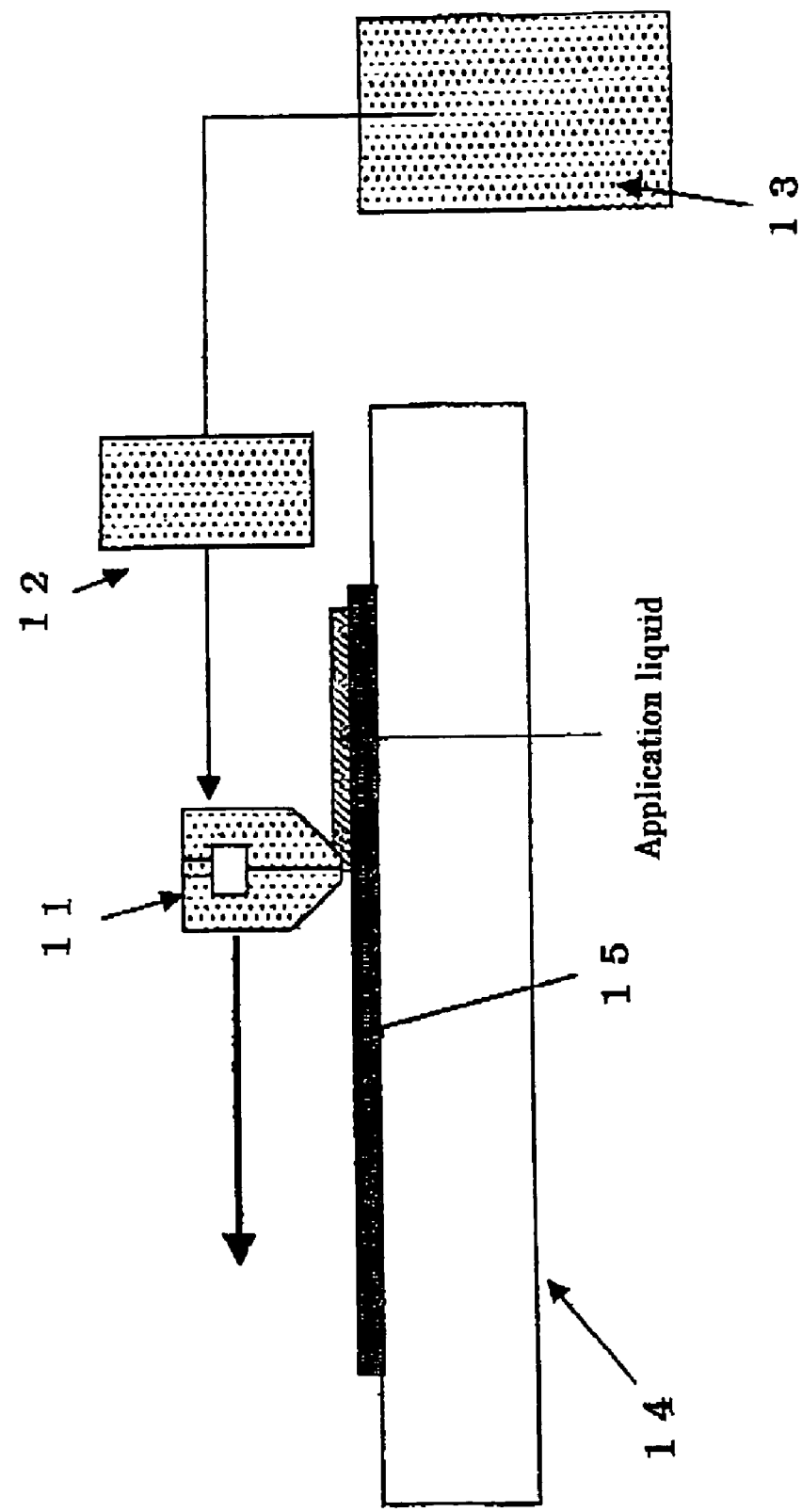

PELLICLE FOR LITHOGRAPHY

BACKGROUND OF INVENTION

1. Field of the Invention

The present invention relates to a pellicle for lithography used for dustproof protection of a mask for lithography used in lithography for forming a fine pattern, and a method for producing it, especially to a large-sized pellicle for lithography used when a liquid-crystal display panel is manufactured.

2. Description of the Related Art

A pattern is formed by exposing a semiconductor wafer or a liquid crystal substrate with light in manufacture of a semiconductor such as LSI, VLSI, or the like, or manufacture of a liquid-crystal display panel. In this case, if dust has adhered to an exposure original plate (a mask for lithography) to be used, the dust absorbs light or bends light. Thus, an transferred pattern may be deformed, or an edge may be rough, and also the ground may be soiled to be black, resulting in degradation of a dimension, a quality, and an appearance or the like, which may lead to a problem of a lowering of performance or production yield of a semiconductor device, a liquid-crystal-display panel, or the like.

For this reason, these works are usually done in a clean room. However, since it is difficult to always keep an exposure original plate clean even in the clean roam, there is adopted a method of attaching a pellicle for dustproof protection which well transmits the light for exposure to the surface of the exposure original plate. In this case, dust does not adhere directly to the surface of the exposure original plate but adheres to the pellicle film. Accordingly, if the focus is on the pattern of the exposure original plate at the time of lithography, the dust on the pellicle film does not affect the transfer.

Such a pellicle fundamentally consist of a pellicle film produced by applying an application liquid which consists of a cellulose nitrate, a cellulose acetate or the like, through which light used for the exposure is transmitted well, to a smooth substrate by a spin coat method, drying the solvent in this application liquid, and peeling a transparent film formed on the substrate from the substrate, and a pellicle frame made of aluminium alloys, such as A7075 subjected to black alumite treatment, stainless steel, polyethylene, or the like, which are adhered by applying a good solvent for the pellicle film to one end face of the frame, and then air-drying it to adhere them (for example, see Japanese Patent Application Laid-open (kokai) No. 58-219023), or being adhered with adhesives, such as an acrylate resin, an epoxy resin or the like (for example, see U.S. Pat. No. 4,861,402 specification or Japanese Patent publication (kokoku) No. 63-27707). Furthermore, the pellicle has a sticking layer for attaching the pellicle to an exposure original plate, made of a polybutene resin, a polyvinyl acetate resin, an acrylate resin, or the like and formed on another end face of the pellicle frame, and a reticle sticking layer protection liner for protecting the reticle sticking layer.

In recent years, a pellicle has come to be used also in a lithography process in processes for production of a liquid-crystal display panel or the like. In this case, as a pellicle to be used, a pellicle with a very large size as 1000 $cm^2$ or more is needed in the case of a one-time exposure formula according to a mirror projection method or the like, as compared with those used in the semiconductor production process (750 $cm^2$ or less, one having a diameter of 12 inch at the largest is practically used). The spin coat method had been conventionally used as a production method of the pellicle film also in the case of a pellicle with such a large size.

However, when the spin coat method is used as a method for producing a pellicle film with a large size as, for example, 1000 $cm^2$ or more, there were the following problems: 1) It is necessary to use a quite large amount of application liquid to be applied on the substrate. Almost all the application liquid is shaken off during rotation, and does not remain as an application liquid film. Therefore, it is quite wasteful, and a manufacturing cost is increased; 2) When the film is formed on a large-sized substrate by the spin coat method, unevenness of a film thickness is increased (for example, a film thickness distribution in plane is over ±10%), and a light transmission is lowered. Therefore, the pellicle film with a sufficient performance cannot be obtained; 3) It is difficult to rotate a large substrate, and it is a problem to rotate the large and heavy substrate at high rate. Therefore the manufacturing cost becomes high. Especially important problems are the problems 1) and 2). When the pellicle film having a large size is actually produced by a spin coat method, there has been a problem that optical characteristics which the pellicle film should have essentially can be hardly obtained.

SUMMARY OF THE INVENTION

The present invention has been accomplished to solve the above-mentioned previous problems. An object of the present invention is to provide a pellicle for lithography with a comparatively large size which can be produced easily and surely, with a low cost compared with a conventional spin coat method, and has a pellicle film having little unevenness of a film thickness and uniform and high light transmission, and a method for producing it.

To achieve the above mentioned object, the present invention provides a pellicle for lithography which has at least, a pellicle film for dustproof protection, a pellicle frame to which the pellicle film is adhered, an adhesive layer provided on one end face of the pellicle frame in order to adhere the pellicle film, and a sticking layer formed on another end face of the pellicle frame, wherein the pellicle film is formed by a die coating machine.

As described above, when the pellicle film is formed by a die coating machine, unevenness of a thickness of the film is suppressed, and a light transmission is also high compared with the pellicle film formed by the conventional spin coat method or the like, even in the case that it is a pellicle film for a large-sized pellicle used for a lithography process in which a larger-sized substrate is dealt with compared with those used for the conventional semiconductor production process or the like. As a result, if such a pellicle is used in a lithography process, a pattern can be suitably formed on a large-sized substrate for pattern formation.

In this case, the pellicle for lithography wherein an area of the pellicle film is 1000 $cm^2$ or more, and a distribution of a thickness of the film in plane is within ±10% is provided.

As described above, according to the pellicle film of the pellicle for lithography of the present invention, even if an area is 1000 $cm^2$ or more, a distribution of a thickness of the film in plane is within ±10%. Accordingly, it has very little unevenness of a film thickness, as compared with the conventional one having a film thickness distribution larger than 10%, and also has a high light transmission, and is suitable to be used for a large-scale lithography process.

In this case, the above-mentioned pellicle for lithography is used in the lithography process for manufacture of liquid-crystal-display panel.

The pellicle film of the pellicle for lithography of the present invention has very little unevenness of a film thickness and a uniform light transmission thereof in a plane, even if it is large-sized as an area of 1000 cm² or more. Accordingly, it is especially preferable to be used in a lithography process for manufacture of a liquid-crystal display panel by which a comparatively large-sized substrate for pattern formation will be treated.

Moreover, the present invention relates to a method for producing a pellicle film comprising at least a process of dissolving a raw material of the pellicle film in a solvent to prepare an application liquid, a process of coating a substrate with the application liquid, and a process of drying the substrate to which the application liquid is applied wherein the coating process is carried out with a die coating machine.

As described above, according to the present invention, in production of the pellicle film, the coating process of the application liquid which has been conventionally carried out with a spin coater or the like is carried out with a die coating machine. Accordingly, even when the pellicle film with a comparatively large area is produced, the waste of the application liquid is little. Furthermore, the pellicle film can be produced easily and at low cost, because it is not necessary to rotate a substrate during application. Moreover, there is produced a pellicle film having very little unevenness of a thickness of the film and a high and uniform light transmission.

In this case, it is desirable to perform the above-mentioned coating process with the die coating machine in an amount of an application liquid in the range obtained from the following formula (1).

$$0.9 \times V1 < V < 1.1 \times V1 \quad (1)$$

$$(V1 = S \times t / (D/100))$$

V(m³): an amount of an application liquid
S (m²): an area of a substrate
t(m): a film thickness after drying
D (%): a concentration of application liquid As described above, the film thickness distribution after drying can be made in the small range as ±10% or less of the desired film thickness after drying by setting an amount of an application liquid V into the amount of the range larger than 0.9 times V1 and smaller than 1.1 times V1 which is a desired amount of an application liquid calculated backward from the desired film thickness after drying t, the substrate area S, and a concentration of an application liquid D.

In this case, the above-mentioned drying process desirably comprises air-dry for 5 minutes or more in the air of which a flow rate on the surface of the substrate is 30 cm or less per second followed by drying at a temperature more than the boiling point of the application liquid.

As described above, if the drying process comprises air-dry for 5 minutes or more in the air of which a flow rate on the surface of the substrate is 30 cm or less per second followed by drying at a temperature more than the boiling point of the application liquid, generation of film thickness unevenness of the pellicle film due to the drying process can be suppressed.

As described above, according to the present invention, the pellicle film having an area of 1000 cm² or more is produced.

As described above, according to a method for producing a pellicle film of the present invention, even when the large one wherein the area of the pellicle film is 1000 cm² or more is produced, only a little amount of the application liquid is required, as compared with the conventional spin coat method, and it is not necessary to rotate a substrate during application. Thus, the pellicle film can be produced easily and at low cost and moreover, there can be produced a pellicle film having very little unevenness of a film thickness and has a high and uniform light transmission.

Moreover, according to the present invention, there is provided a method for producing a pellicle for lithography comprising at least providing an adhesive layer on one end face of a pellicle frame, adhering the pellicle film produced by the above-mentioned method of the present invention with the adhesive layer to one end face of the above-mentioned pellicle frame, and the pellicle for lithography produced by this method.

The pellicle for lithography produced described above has a suppressed unevenness of a film thickness and a uniform light transmission, as compared with the pellicle film formed by the conventional spin coat method or the like, even in the case of producing a comparatively large-sized one used in the lithography process for, for example, manufacture of liquid-crystal display panel. Therefore, if such a pellicle is used at a lithography process, a pattern can be formed suitably on a large-sized substrate for pattern formation.

As explained above, according to the present invention, the pellicle which has little local unevenness of film thickness and little deviation thereof in plane, and has a uniform and high light transmission can be produced easily and at low cost, using the die coating machine, compared with those using the conventional spin coater, in performing film formation of the pellicle film of the pellicle with very large size compared with those used in the semiconductor production process or the like.

BRIEF DESCRIPTION OF THE DRAWINGS

FIG. 2 is a schematic view showing one example of a die coating machine used for the present invention.

BEST MODE FOR CARRYING OUT THE INVENTION

Figure 1:
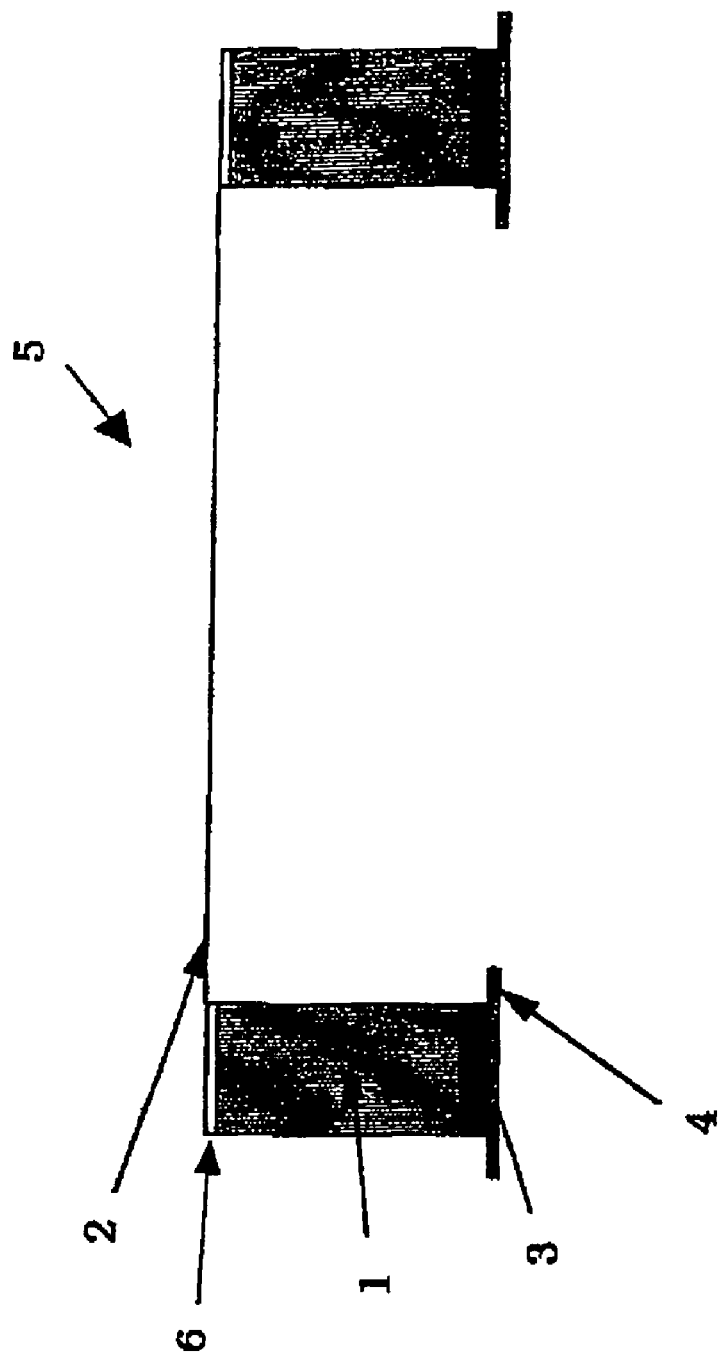
FIG. 1 is a schematic view showing constitution of the pellicle of the present invention.

As a result of further studying, the inventors of the present invention have found that a pellicle for lithography which has a pellicle film having very little unevenness of a film thickness and has a high and uniform light transmission can be produced easily and at low cost, if the pellicle film is formed by a die coating machine instead of a spin coater as performed conventionally, when producing a relatively large pellicle for lithography as used in a lithography process for manufacture of liquid-crystal display panel. Thereby, the present invention has been completed.

The present invention will be explained below in detail, but the present invention is not limited thereto.

As shown in FIG. 1, a pellicle 5 of the present invention consists of, at least, a pellicle frame 1, a pellicle film 2, a sticking layer 3, and an adhesive layer 6. The pellicle 5 is what the pellicle film 2 is adhered with the adhesive layer 6 for adhesion of the pellicle film to one end face of the pellicle frame 1. In that case, the sticking layer 3 for adhesion of a reticle is usually formed in another end face, and a liner for protection (a release layer) 4 is attached, in a manner that it can be peeled off, to the lower end face of the sticking layer 3 for adhesion of the reticle.

The pellicle film of the pellicle for lithography of the present invention has little unevenness of a film thickness and has a uniform light transmission, even if it is a large-sized, compared with those having an area size of 750 cm² or less used for a conventional manufacturing process of a semiconductor or the like, for example, those used at a lithography process in manufacture of a liquid-crystal display panel or the like. That is, even if the pellicle film is a large-sized one which has an area of 1000 cm² or more, it has very little unevenness of a thickness as being within ±10% and further within ±5%, and has a uniform and high light transmission, as compared with those having a larger thickness distribution as being larger than ±10% in a plane formed by the conventional spin coat method or the like. Moreover, an area of the pellicle film can be 10000 cm² or more, and those in the range of 50000 cm² or more is also possible. Even if it is such a large-sized one, it has little unevenness of a thickness and a high light transmission. A thickness of the pellicle film described above is desirably in the range of 0.5 μm or more and 20 μm or less from the points of a film strength, cost performance and the like.

Such a pellicle film should be produced by, at least, a process of dissolving a raw material of the pellicle film in a solvent to prepare an application liquid, a process of coating a substrate with the application liquid by a die coating machine, and a process of drying the substrate to which the application liquid is applied.

First, the process of preparing an application liquid will be explained. Although the kind of a raw material of the pellicle film is not particularly limitative, there may be used for example, cellulose nitrate, cellulose acetate, amorphous fluorine polymer, or the like. Examples of amorphous fluorine polymer may include: Cytop (manufactured by Asahi Glass Co., Ltd., tradename), Teflon AF (manufactured by Dupont, tradename), or the like. These polymers (the raw material of the pellicle film) may have been dissolved in the solvent beforehand, or it may be dissolved in a solvent if needed, when the pellicle film is produced, and used. For example, it may be suitably dissolved in a fluorine solvent or the like.

The coating process may be performed by a die coating machine. Although the kind of a die coating machine is not particularly limitative, it is preferable to use those wherein a uniformity of a thickness of an application liquid film is high, when application liquid is applied, and unevenness of the film thickness of the pellicle film after drying is hardly caused.

For example, the die coating machine 11 as shown in FIG. 2 can be used. The die coating machine 11 is connected to a tank 13 which contains the application liquid through the discharge pump 12. The application liquid of the tank 13 is discharged with the discharge pump 12, while the die coating machine 11 moves, and thereby the substrate 15 placed on the table 14 is coated with the application liquid in a desired thickness.

In the pellicle film with which optical uniformity is especially required, since the uniformity of the film after application is important, it is necessary that a slot die of the die coating machine faces downward, and the discharged liquid is appied on the flat substrate which is placed on the horizontal plane. As the die coating machine, there can be used a well-known conventional technique. For example, those exemplified in Japanese Patent publication No. 2644457 and Japanese Patent Application Laid-open (kokai) No. 10-421 can be suitably used as such a die coating machine. For example, there can be used the slot die coating machine FLORIA II (manufactured by Chugai Ro Co., Ltd., tradename), a super precision discharge type FAS coating equipment MH-1600 (manufactured by SHIMADZU CORPORATION, tradename) or the like.

An amount of an application liquid to be applied by the die coating machine can be suitably decided by the desired thickness after drying.

Specifically, the amount of an application liquid is preferably defined according to the following formula.

$$0.9 \times V1 < V < 1.1 \times V1 \quad (1)$$

$$(V1 = S \times t/(D/100))$$

$V(m^3)$: An amount of an application liquid
$S (m^2)$: An area of a substrate
$t(m)$: A film thickness after drying
$D (\%)$: A concentration of an application liquid The amount of the application liquid V can be obtained from V1 which is a desired amount of an application liquid calculated backward from the desired film thickness after drying t, the substrate area S, and a concentration of an application liquid D. The film thickness distribution after drying can be made in the small range, for example, as ±10% or less of the desired thickness after drying by setting an amount of an application liquid V into the amount of the range larger than 0.9 times V1 and smaller than 1.1 times V1. Since the film thickness after drying is defined by an amount of an application liquid at the time of coating, it is necessary that an amount of an application liquid at the time of coating is to be in the range of at least ±10% or less of a desired amount of an application liquid. If the coating is performed by the die coating machine, it is easy to be coated with the application liquid in ±10% or less of range. As a result, the film thickness after drying can be made within ±10%. Especially, it is also possible to make it within ±5%, if it is a die coating machine.

A drying process can be performed by air drying for volatilizing a solvent to some extent in the air first, and then drying by heating for removing a solvent completely with a dryer or a hot plate. If the above-mentioned air dry performed before the heating-dry is performed under the strong descending air current in a clean room, unevenness of a thickness will be caused to the finished film. Therefore, it is desirable to dry for 5 minutes or more under a suitable air current, preferably under air current of 30 cm or less per second. In addition, a time of drying is desirably less than 100 minutes. Because, even if drying is performed longer than 100 minutes, effect of the drying does not improved so much, but a harmful effect such as adhesion of dust may be increased. Moreover, it is desirable to perform the above-mentioned heating-dry by a dryer or the like with making a temperature difference between a substrate and a film surface of an application liquid film as small as possible, in order to prevent a convection current from occurring in a film of an application liquid film during drying.

Next, the pellicle frame, the adhesive layer, and the sticking layer which constitute the pellicle for lithography will be explained. In the present invention, they can be made of known material.

The material of the pellicle frame is not particularly limitative. Examples thereof may include those obtained by anodizing the aluminum material used conventionally to conduct black oxide finish with a black dye, steel, stainless steel, resins such as polyacetal, polycarbonate, PMMA (poly methyl methacrylate), and an acrylate resin, blue glass, quartz glass, and the like.

Although the surface of the pellicle frame is usually roughened by sandblasting or chemical polishing in the present invention, the method of roughening the surface of the frame is not limitative. For example, when aluminum material is used, there is known a method of roughening a surface by performing a blast treatment of the surface with stainless steel, carborundum, glass beads, or the like, and then further performing a chemical polishing with NaOH or the like, which can be used for the present invention.

On the other hand, if there is no limitation especially in a lithography process, the surface of the pellicle frame can be remained smooth, and dyeing or painting may not be performed. So, it will not be restricted to these.

Moreover, at least one gas-passage may be provided in at least one side surface of a pellicle frame. However, if there is no need, it is not necessary to provide the gas-passage.

In the case that the gas-passage is provided, the size, the shape, the number, and the place of the gas-passage is not limitative. It is desirable to select the size, the shape, the number, and the place depending on the mesh size of the filter provided to the gas passage opening which is an opening of the gas-passage, a filtering-area or an amount of air flow resulted from them. It is preferable not to provide a large gas-passage opening more than necessary, but to provide a gas-passage opening with a minimum size to be required.

There is especially no limit in the size, the shape, and the material of a filter for removal of dust used for the gas-passage opening, as far as it can be provided at the gas-passage opening. Examples of the material of this filter may include a resin (PTFE (polytetrafluoro ethylene), nylon 66 or the like), metals (316L stainless steel or the like), ceramics (alumina, aluminum nitride, or the like), or the like.

The adhesive of the adhesive layer for adhesion of a pellicle film may be one used conventionally. For example, a polyacrylate adhesive, an epoxy resin adhesive, silicone resin adhesives, and fluorine polymer, such as fluorine-containing silicone adhesives, or the like can be mentioned. A silicone resin and fluorine polymer are suitable especially.

The sticking layer for sticking of reticle can be formed by a double-stick tape, a silicone resin binder, an acrylic binder, a hot-melt binder, or the like.

The pellicle of the present invention can be produced by adhering a pellicle film with the adhesive layer for adhesion of a pellicle film to one end face of the pellicle frame by a usual method, and usually forming the sticking layer for attaching a reticle in another end face. A mold release layer (a liner for protection) is formed on the end face on the side of the sticking layer for attaching a reticle in a way that it can be peeled off. Here, the adhesive layer for adhesion of a pellicle film formed on one end face of the pellicle frame can be formed by diluting adhesives with a solvent if necessary, applying it on one end face of the pellicle frame, heating it to be dried and cured. In this case, as the method of application of adhesives, a brush coating, the method by a spray, an automatic dispenser, or the like can be used.

The material of the above-mentioned liner for protection of the sticking layer for attaching a reticle is not limitative. Examples of them may include PET (polyethylene terephthalate), PTFE, PFA, PE, PC (polycarbonate), vinyl chloride, PP (polypropylene), stainless steel, aluminum foil, or the like. Those obtained by applying the mold release agent which affording a releasable property from a sticking layer on the above material can be used.

EXAMPLE

Hereafter, the present invention will be specifically explained referring to an example and a comparative example.

Example 1

First, the frame made of an aluminum alloy with an outer dimension of 800 mm×900 mm×5 mm width and a frame thickness of 6 mm was prepared for a pellicle frame. The gas-passage with a diameter of 1.0 mm was prepared in the center of one side face of this frame.

The surface of the frame was cleaned, and then subjected to surface treatment using glass beads for one minute with a sandblasting apparatus at a discharge-pressure of 1.5 kg/cm$^2$, to roughen the surface. Subsequently, it was subjected to treatment in a NaOH processing bath for 10 seconds and cleaned, and then was anodized and black-dyed, and subjected to a sealing treatment, to form a black oxide coating on the surface.

This frame made of an aluminum alloy was cleaned using pure water and an ultrasonic cleaner together. Subsequently, a silicone binder was applied using a spray coating apparatus to the internal surface of this frame at 1 µm.

Subsequently, a filter made of PTFE having a dust filtration size (mesh size) of 0.1 to 3.0 µm, a filtration efficiency of 99.9999%, and a width of 9.5 mm, a height of 2.5 mm, a thickness of 300 µm was attached at the opening of the above-mentioned gas-passage. Thereby, the pellicle frame was produced.

Subsequently, Teflon AF1600 (manufactured by U.S. Dupont, tradename) was dissolved in a fluorine solvent Fluorinert FC-75 (manufactured by U.S. 3M, tradename), to prepare a solution with 6% of concentration.

Then, a coated film with a film thickness of 35 µm was formed using a slot die coating machine (FROLIA II, manufactured by Chugai Ro Co., Ltd, tradename) with the solution (an application liquid concentration D=6%) on the surface of a synthetic quartz substrate with 1000 mm×1000 mm (a substrate area S=1 m$^2$) and a thickness of 5 mm, which was subjected to mirror polishing, in order to obtain a pellicle film with a thickness of 2 µm (a thickness after drying t=2×10$^{-6}$ m) (the amount of an application liquid V=the coating film thickness×the area of the substrate=35× 10$^{-6}$ m$^3$ (35 ml)) (V1=S×t/(D/100)=33.3×10$^{-6}$ m$^3$, therefore, 0.9×V1<V=35×10$^{-6}$ m$^3$ (35 ml)<1.1×V1).

Then, this coated film was dried by standing for 30 minutes in the vertical laminar flow type clean booth with an air flow rate of 10 cm, and then dried for 2 minutes at 180° C. in the clean bake furnace. Thereby the pellicle film with a thickness of 2 µm was formed.

Then, the pellicle film and the jig for producing of a pellicle which has a frame with an outer size of 1000 mm×1000 mm×10 mm width and a thickness of 10 mm were adhered together using the epoxy adhesive Araldite Rapid (manufactured by Showa Highpolymer Co., Ltd., tradename), and then peeled off from the surface of the synthetic quartz substrate in air.

Then, the silicone binder was applied to one end face of the pellicle frame made of an aluminum alloy prepared as mentioned above, heated at 100° C. for 10 minutes to be dried and cured. Thereby, a sticking layer was formed. Moreover, the fluorine polymer adhesives CT 69 (manufactured by Asahi Glass Co., Ltd., tradename) diluted with a fluorine solvent CT solve 180 (manufactured by Asahi Glass Co., Ltd., tradename) was applied to another end face of the pellicle frame made of aluminium alloy, and heated at 100° C. for 10 minutes to be dried and cured. Thereby, the adhesive layer was formed. The liner made of PET was prepared and attached to the above-mentioned sticking layer of the pellicle frame with the liner attaching apparatus equipped with an image-processing positioning device by the CCD camera.

After bringing the adhesive layer of the above-mentioned pellicle frame closely contact with the surface of the pellicle film made of Teflon AF1600 prepared above, the pellicle frame was heated with IR lamp to weld the pellicle frame and the pellicle film together. Two of the frames of the pellicle frame and the jig for producing of the pellicle were fixed with facing the adhesion side of the pellicle frame upward and attaching it to the jig for fixing, so that the position of the jig for fixing might not shift relatively. Subsequently, the frame of the jig for producing of the pellicle outside the pellicle frame was pulled up, and fixed, and then the tension of 0.5 g/cm was given to the pellicle film part outside the pellicle frame.

Subsequently, cutting removal of the unnecessary pellicle film outside the pellicle frame was carried out, using the cutter attached to the SCARA robot by moving the cutter along with the circumference section of the adhesive layer portion of the above-mentioned pellicle frame with dropping Fluorinert FC-75 (manufactured by Dupont, tradename) at 10 μl/min by the tube type dispenser.

The distribution of the thickness of the pellicle film of the pellicle for lithography produced described above was measured with the transmission measurement apparatus manufactured by Otsuka Electronics Co., Ltd. The measurement was performed by measuring inside the film surface with 1000×1000 mm in the shape of a lattice at an interval of 50 mm. The result of the measurement and the amount of the application liquid in the film formation test of this example were shown below in the table 1.

Comparative Example 1

The thickness distribution was measured by the same method as Example 1 as for the pellicle film of the pellicle for lithography which was produced by the same method as Example 1 except that the film formation of the pellicle film was carried out by a spin coat method. The result of the measurement and an amount of the application liquid in a film formation test of this comparative example were shown in Table 1.

TABLE 1

| | Film formation method | Distribution in plane | Amount of application liquid (ml) |
| --- | --- | --- | --- |
| Example 1 | Slot die coating machine | ±5% | 35 |
| Comparative Example 1 | Spin coating machine | ±11% | 350 |

The table 1 shows that a thickness distribution of the pellicle film in plane was within ±5% in Example 1 wherein the film formation of the pellicle film was carried out by the die coating machine, and it is clear that a higher thickness uniformity is achieved, as compared with ±11% in Comparative example 1 wherein the film formation was carried out by the spin coater. If the thickness uniformity is high as described above, the light transmission is uniform.

Moreover, the amount of the application liquid needed for performing film formation of the pellicle film in Example 1 was a tenth of the amount in Comparative Example 1. Accordingly, it was revealed that a significant amount of the application liquid can be saved.

The present invention is not limited to the above-described embodiment. The above-described embodiment is a mere example, and those having the substantially same structure as that described in the appended claims and providing the similar action and effects are included in the scope of the present invention.

What is claimed is:

1. A pellicle for lithography which has at least, a pellicle film for dustproof protection, a pellicle frame to which the pellicle film is adhered, an adhesive layer provided on one end face of the pellicle frame in order to adhere the pellicle film, and a sticking layer formed on another end face of the pellicle frame, wherein the pellicle film is formed by a die coating machine, an area of the pellicle film is 1000 cm$^2$ or more, and a distribution of a thickness of the film in plane is within ±10%.

2. A lithographic process for manufacturing a liquid-crystal-display panel, comprising attaching the pellicle for lithography according to claim 1 to an exposure plate.

* * * * *